United States Patent
Podlaseck et al.

(10) Patent No.: US 6,350,493 B1
(45) Date of Patent: Feb. 26, 2002

(54) METHOD OF DISPERSING FIBERS IN ELECTROMAGNETIC-ATTENUATING COATING MATERIALS

(75) Inventors: Stanley Podlaseck; Gene P. Shumaker; Paul D. Rimer, all of Orlando; Roger A. Purcell, Deland, all of FL (US)

(73) Assignee: Lockheed Martin Corporation, Bethesda, MD (US)

( * ) Notice: Subject to any disclaimer, the term of this patent is extended or adjusted under 35 U.S.C. 154(b) by 0 days.

(21) Appl. No.: 08/203,624

(22) Filed: Mar. 1, 1994

(51) Int. Cl.$^7$ ............... B01F 11/00; B05D 1/02
(52) U.S. Cl. ............. 427/421; 427/196; 366/108; 366/110; 366/111
(58) Field of Search ............... 427/421, 196; 366/108, 110, 111, 240, 605

(56) References Cited

U.S. PATENT DOCUMENTS

| | | |
|---|---|---|
| 2,923,934 A | 2/1960 | Halpern ............... 343/18 |
| 2,929,436 A | 3/1960 | Hampshire ............... 154/1 |
| 3,599,210 A | 8/1971 | Stander ............... 343/18 |
| 3,843,593 A | 10/1974 | Shell et al. ............... 260/40 R |
| 4,325,849 A | 4/1982 | Rosen et al. ............... 252/62 |
| 4,360,440 A | 11/1982 | Boyer et al. ............... 252/62 |
| 4,429,216 A | 1/1984 | Brigham |
| 4,474,685 A | 10/1984 | Annis ............... 252/503 |
| 4,534,998 A | 8/1985 | DuPont et al. ............... 427/122 |
| 4,569,786 A | 2/1986 | Deguchi |
| 4,610,808 A | * 9/1986 | Kleiner ............... 252/512 |
| 4,664,971 A | 5/1987 | Soens ............... 428/288 |
| 4,678,699 A | 7/1987 | Kritchevsky et al. |
| 4,738,896 A | 4/1988 | Stevens ............... 428/315.9 |
| 4,759,950 A | 7/1988 | Stevens ............... 427/55 |
| 4,789,563 A | 12/1988 | Stevens ............... 427/252 |
| 4,839,402 A | 6/1989 | Stevens ............... 523/200 |
| 4,862,713 A | 9/1989 | Kutz et al. ............... 68/21 |
| 4,935,296 A | 6/1990 | Stevens ............... 428/288 |
| 4,973,514 A | * 11/1990 | Gamble et al. ............. 428/297 |
| 4,983,456 A | 1/1991 | Iwaskow et al. ............. 428/254 |
| 5,061,566 A | * 10/1991 | Morgan ............... 428/423.1 |
| 5,089,326 A | 2/1992 | Bonazza ............... 428/284 |
| 5,210,116 A | 5/1993 | Hashimoto et al. |
| 5,284,701 A | 2/1994 | Hamon |
| 5,312,678 A | 5/1994 | McCullough, Jr. et al. |
| 5,366,664 A | 11/1994 | Varadan et al. |

* cited by examiner

*Primary Examiner*—Shrive P. Beck
*Assistant Examiner*—Jennifer Calcagni
(74) *Attorney, Agent, or Firm*—Burns, Doane, Swecker & Mathis, LLP

(57) ABSTRACT

A method of dispersing fibers in an electromagnetic-attenuating coating and applying the coating to a substrate. The method includes mixing a coating material of fibers and resin in a container such that the fibers are uniformly dispersed in the resin without breaking the fibers. The method also includes feeding the coating material from the container while maintaining the fibers uniformly dispersed in the resin and without breaking the fibers. In addition, the method includes applying the coating material to a substrate. The mixing is carried out by subjecting the container to an oscillatory shaking action, the feeding step is carried out by pressurizing the container and ejecting the coating material through a bottom opening in the container and the applying step is carried out by spraying the coating material on the substrate with an air-nozzle spray gun.

34 Claims, No Drawings

METHOD OF DISPERSING FIBERS IN ELECTROMAGNETIC-ATTENUATING COATING MATERIALS

This invention was made with Government support under Contract No. N00014-89-C-2221 awarded by the Department of Defense. The Government has certain rights in this invention.

BACKGROUND OF THE INVENTION

Field of the Invention

The present invention relates to a method of dispersing fibers in electromagnetic-attenuating coating materials.

Electromagnetic interference (EMI) shielding materials are disclosed in U.S. Pat. Nos. 4,935,296 and 5,089,326. The '296 patent discloses a composite containing an EMI shieldingly effective amount of metal-coated fibers and details of such fibers can be found in U.S. Pat. Nos. 4,738,896; 4,759,950; 4,789,563 and 4,839,402.

Radar absorptive coating materials are disclosed in U.S. Pat. Nos. 3,599,210 and 3,843,593. The '210 patent discloses a coating containing fibers cut to a length of one-half wavelength of the anticipated radar frequency with the fibers being insulated along their lengths by thinly bonding a dielectric, low loss material such as unfilled epoxy, pure resin or varnish and the fibers are randomly dispersed within a solid matrix of resinous material. The '593 patent discloses a coating containing iron pigment in a resin matrix.

U.S. Pat. No. 4,983,456 discloses electrically conductive laminates, conductive coatings, conductive adhesives, conductive inks, conductive gaskets and conductive caulking and sealing compounds wherein metal coated fibers are utilized. The '456 patent further discloses polymeric material convertible by heat or light, alone or in combination with catalysts, accelerators, cross-lining agents, etc., can be combined with the composite fibers. The fibers include a semimetallic core made of carbon, boron or silicon carbide and an electrically and/or thermally conductive layer of at least one electro-depositable metal such as nickel, silver, zinc, copper, lead, arsenic, cadmium, tin, cobalt, gold, indium, iridium, iron, palladium, platinum, tellurium, tungsten or mixtures thereof.

The following U.S. patents relate generally to methods of mixing filler or fibers in resin matrixes and/or applying a mixture of resin and filler/fiber material onto a substrate. The patents include U.S. Pat. Nos. 2,923,934; 2,929,436; 3,599,210; 4,325,849; 4,360,440; 4,474,685; 4,534,998; 4,862,713; 4,935,296; and 4,983,456. The foregoing patents, however, fail to appreciate the importance of avoiding breakage of fibers during mixing of the fibers with a resin matrix and during applying the mixture to a substrate. For instance, with respect to electromagnetic-attenuating materials such breakage could result in fibers having lengths that reduce, and conceivably even eliminate the desired electromagnetic-attenuating property.

SUMMARY OF THE INVENTION

The invention provides a method of dispersing fibers in an electromagnetic-attenuating coating and applying the coating to a substrate. The method includes steps of mixing a coating material comprising fibers and resin in a container such that the fibers are uniformly dispersed in the resin without breaking the fibers. The method also includes feeding the coating material from the container while maintaining the fibers uniformly dispersed in the resin and without breaking the fibers. In addition, the method includes applying the coating material to a substrate.

According to various features of the invention, the mixing step can be carried out by subjecting the container to an oscillatory shaking action such that the fibers are subjected to a high-shear mixing action without breaking the fibers. The feeding step can be carried out by pressurizing the container and ejecting the coating material through an opening in the container. For instance, the coating material can be fed through a conduit attached to a bottom opening in the container. The applying step can comprise spraying the coating material on the substrate. For instance, the spraying can be carried out with an air-nozzle-spray gun.

The electromagnetic-attenuating coating can comprise fibers in a dielectric matrix material. The fibers can comprise metal-coated dielectric or semiconductive fibers. For instance, the fibers can be selected from the group consisting of glass, fused silica, silicon carbide and graphite fibers. The fibers preferably have a uniform diameter, a circular cross-section, a rectilinear shape, a smooth exterior surface and a diameter of 4–20 microns ($\mu$m). For instance, the fibers can be rectilinear nickel-coated graphite fibers. The fibers are preferably uniformly dispersed in the resin and can comprise less than 1%, preferably less than 0.2% by weight of the matrix. The resin can comprise a thermosetting plastic material such as a polymer material or a synthetic resin such as silicone. The resin is preferably a non-thermoplastic material.

DETAILED DESCRIPTION OF THE INVENTION

According to the invention, long conductive fibers can be uniformly dispersed in an artificial dielectric coating and the coating can be applied by spraying the coating on a substrate in a controlled, repeatable manner to produce the desired electromagnetic-attenuating property.

The successful utilization of artificial dielectric coatings requires a uniform dispersion of fibers in a resin matrix and then applying the fiber-containing resin matrix onto a substrate in such a manner as to provide random fiber placement and uniform thickness control. Prior to the invention, it has not been possible to consistently obtain true random dispersion of conductive fibers in a resin matrix and spray uniform coatings of the fiber-containing matrix without damaging or breaking the fibers. The invention overcomes such problems by mixing the coating material in a manner which avoids breakage of the fibers and applying the coating in a manner which maintains the fibers uniformly dispersed in the resin but without breaking the fibers.

Prior to the invention, agitator-type mixing systems have been the preferred method of dispersing long conductive fibers in a resin matrix. In order to obtain complete dispersion of the fibers it has been necessary to obtain a "high shear" mixing action but such mixing action tends to break and damage the conductive fibers. Also, standard top-feed pressure-pot spray systems with either external- or internal-mix needle valve spray guns have been found to promote fiber clumping and breakage since they do not provide a smooth, unrestricted passage for the fiber-containing matrix. According to the invention, mixing of the conductive fibers in the resin matrix can be achieved using an oscillatory shaking action to provide the necessary "high-shear" type of mixing without the fiber-breakage normally associated with the "high-shear" mixing. For instance, according to the invention, the mixing can be performed with a RED DEVIL PAINT SHAKER. Optimal fiber dispersion, however, will depend upon the viscosity of the resin matrix and the degree of shaking performed. A suitable combination of variables sufficient to obtain complete random dispersion of the fibers will be apparent to persons skilled in the art.

According to the invention, spray application of the fiber-containing matrix can be achieved with a smooth and unrestricted fluid transfer system which eliminates fiber damage. For instance, such fluid transfer can be obtained by using a modified bottom-outlet pressure pot, large-diameter (e.g. ½–¾ inch) fluid hoses and excessively large-diameter rear-seat fluid and air nozzle spray guns like the Binks 18 D with 69×202 nozzle assembly or a Graco 204000 with 167–300 and 160–321 nozzle assembly. Adjustment of the atomizing and fluid air pressures will allow repeatable uniform spraying of the coating.

Over the past several years, stainless steel fibers available in 4–20 micron effective diameters have been the fiber of choice in many artificial dielectric coating designs. These fibers have been selected because of their electrical conductivity and low cost. In addition, they are readily available in a variety of diameters. To date, unfortunately, a successful technique has not been found for dispersing the stainless steel fibers in a resin binder such that the electrical performance of the coating is predictable, repeatable and consistent.

It has been discovered that metal-coated dielectric or semi-conductive fibers can approximate the electrical conductivity of an equivalent-diameter stainless steel fiber and the resulting artificial dielectric coating can be applied repeatedly and consistently, in a manner which yields the desired electrical performance. Although the metal-coated fibers are slightly more costly than the stainless steel fibers, their concentration in the coating can be adjusted such that the cost of the coating does not vary significantly from a stainless-steel-fiber-containing coating. The metal-coated fibers also offer additional advantages such as the ability to tailor larger and smaller diameter fibers to achieve a broad range of conductivities.

The artificial dielectric coatings applied according to the method of the invention can utilize a uniform dispersion of fibers in a resin matrix, the fibers having uniform, discrete lengths, diameters and electrical conductivities. Whereas metallic fibers suffer agglomeration and clumping problems leading to lack of consistency and repeatability in their electrical performance, the metal-coated fibers disperse uniformly and give predictable and repeatable electrical performance.

The fibers used in the coating applied according to the method of the invention can be selected from the group consisting of glass, fused silica, silicon carbide and graphite fibers. For instance, the fibers can be commercially available graphite fibers such as Hercules type AS-4 or Amoco products type T-300 fibers. The metal coating can be any suitable metal such as nickel and the metal can be applied to the fibers by any suitable technique such as by chemical vapor deposition. The metal coating should have a thickness sufficient to approximate the electrical conductivity of an equivalent-diameter stainless steel fiber. U.S. Pat.

FIELD OF THE INVENTION

The present invention relates to a method of dispersing fibers in electromagnetic-attenuating coating materials. Nos. 4,738,896; 4,759,950; 4,789,563; 4,839,402; and 4,935,296, the disclosures of which are hereby incorporated by reference, disclose techniques for preparing metal-coated fibers which can be used in the coating.

The lengths and diameters of the metal-coated fibers, the coating thickness, the range of tolerance of the metal-coating thickness on the fibers, the amount of fibers loaded into the matrix and materials used for the fibers and metal coating on the fibers will determine the range of frequencies which can be attenuated by the electromagnetic-attenuating coating. The selection of the above parameters for attenuating a particular frequence range will be apparent to persons skilled in the art.

The fibers are uniformly dispersed in a lightly loaded dielectric matrix material. The matrix material comprises a resin material which preferably is a non-thermoplastic material. For instance, the resin can comprise a thermosetting polymer material such as silicone.

The foregoing has described the principles, preferred embodiments and modes of operation of the present invention. However, the invention should not be construed as being limited to the particular embodiments discussed. Thus, the above-described embodiments should be regarded as illustrative rather than restrictive, and it should be appreciated that variations may be made in those embodiments by workers skilled in the art without departing from the scope of the present invention as defined by the following claims.

What is claimed is:

1. A method of dispersing fibers in an electromagnetic-attenuating coating and applying the coating to a substrate, comprising steps of:

mixing fibers into a silicone resin in a container to produce a coating material, wherein the mixing step occurs solely by shaking the container such that the fibers are uniformly dispersed in the silicone resin without breaking the fibers;

feeding the coating material from the container by shaking the container while maintaining the fibers uniformly dispersed in the silicone resin and without breaking the fibers; and applying the coating material to a substrate.

2. The method of claim 1, wherein the mixing step is carried out by subjecting the container to an oscillatory shaking action such that the fibers are subjected to a high-shear mixing action without breaking the fibers.

3. The method of claim 1, wherein the feeding step is carried out by pressurizing the container and ejecting the coating material through an opening in the container.

4. The method of claim 1, wherein the feeding step is carried out by feeding the coating material through a conduit attached to a bottom opening in the container.

5. The method of claim 1, wherein the applying step comprises spraying the coating material on the substrate.

6. The method of claim 1, wherein the applying step is carried out with an air nozzle spray gun.

7. The method of claim 1, wherein the silicone resin comprises a dielectric matrix material and the fibers are uniformly dispersed in the dielectric matrix material, the fibers comprising metal-coated dielectric or semiconductive fibers in an amount of less than 1 wt % of the coating.

8. The method of claim 1, wherein the fibers are selected from the group consisting of glass, fused silica, silicon carbide and graphite fibers.

9. The method of claim 1, wherein the fibers have a uniform diameter.

10. The method of claim 1, wherein the fibers have a circular cross section.

11. The method of claim 1, wherein the fibers are rectilinear in shape.

12. The method of claim 1, wherein the fibers have a smooth exterior surface.

13. The method of claim 7, wherein the metal coating on each of the fibers has a uniform thickness.

14. The method of claim 1, wherein the fibers are rectilinear graphite fibers.

15. The method of claim 1, wherein the fibers have a diameter of 4 to 20 μm.

16. The method of claim 1, wherein the fibers are nickel-coated graphite fibers.

17. The method of claim 1, wherein the fibers comprise less than 0.2% by weight of the coating.

18. The method of claim 1, wherein the fibers are friable.

19. The method of claim 18, wherein the fibers comprise less than 0.2% by weight of the coating.

20. A method of dispersing fibers in an electromagnetic-attenuating coating and applying the coating to a substrate, comprising the steps of:

mixing electrically conductive fibers into a liquid silicone resin in a container to produce a coating material, wherein the mixing step occurs solely by subjecting the container to an oscillatory shaking action such that the fibers are subjected to a high-shear mixing action and such that the fibers are uniformly dispersed in the liquid silicone resin by the high-shear mixing action without breaking the fibers;

feeding the coating material from the container while maintaining the fibers uniformly dispersed in the liquid silicone resin and without breaking the fibers; and applying the coating material to a substrate.

21. The method of claim 20, wherein the feeding step is carried out by pressurizing the container and ejecting the coating material through an opening in the container.

22. The method of claim 20, wherein the feeding step is carried out by feeding the coating material through a conduit attached to a bottom opening in the container.

23. The method of claim 20, wherein the applying step comprises spraying the coating material on the substrate.

24. The method of claim 23, wherein the applying step is carried out with an air nozzle spray gun.

25. A The method of claim 20, wherein the silicone resin comprises a dielectric matrix material and the fibers are uniformly dispersed in the dielectric matrix material, the fibers comprising metal-coated dielectric or semiconductive fibers in an amount of less than 1 wt % of the coating.

26. The method of claim 20, wherein the fibers are selected from the group consisting of glass, fused silica, silicon carbide and graphite fibers.

27. The method of clam 20, wherein the fibers have a uniform diameter, a circular cross section, are rectilinear in shape, a smooth exterior surface, or combination thereof.

28. The method of claim 25, wherein the metal coating on each of the fibers has a uniform thickness.

29. The method of claim 20, wherein the fibers comprise friable fibers.

30. The method of claim 20, wherein the fibers are rectilinear graphite fibers.

31. The method of claim 20, wherein the fibers have a diameter of 4 to 20 μm.

32. The method of claim 20, wherein the fibers are nickel-coated graphite fibers.

33. The method of claim 20, wherein the fibers comprise less than 0.2% by weight of the coating.

34. A method of dispersing fibers in an electromagnetic-attenuating coating material comprising electrically conductive fibers and liquid silicone resin, the method comprising dispersing the fibers in the silicone resin solely by subjecting a container containing the coating material to an oscillatory shaking action such that the fibers are subjected to a high-shear mixing action and such that the fibers are uniformly dispersed in the silicone resin by the high-shear mixing action without breaking the fibers, wherein the fibers comprise less that 0.2% by weight of the coating.

* * * * *

UNITED STATES PATENT AND TRADEMARK OFFICE
CERTIFICATE OF CORRECTION

PATENT NO.    : 6,350,493 B1                                           Page 1 of 1
DATED         : February 26, 2002
INVENTOR(S)   : Stanley Podlaseck, Gene P. Shumaker, Paul D. Rimer and Roger A. Purcell It is certified that error appears in the above-identified patent and that said Letters Patent is hereby corrected as shown below:

<u>Column 6,</u>
Line 32, delete "and";
Line 35, change "that" to -- than --.

Signed and Sealed this

Twenty-eighth Day of May, 2002

Attest:

*Attesting Officer*

JAMES E. ROGAN
*Director of the United States Patent and Trademark Office*